United States Patent [19]

Taguchi et al.

[11] Patent Number: 4,816,383

[45] Date of Patent: Mar. 28, 1989

[54] METHOD FOR FORMING FINE PATTERNS OF CONJUGATED POLYMERS

[75] Inventors: Satoshi Taguchi, Suita; Toshihiko Tanaka, Ibaraki, both of Japan

[73] Assignee: Sumitomo Chemical Company, Limited, Osaka, Japan

[21] Appl. No.: 98,882

[22] Filed: Sep. 21, 1987

[30] Foreign Application Priority Data

Sep. 26, 1986 [JP] Japan .................................. 61-228962

[51] Int. Cl.$^4$ ........................... G03C 5/00; G03C 5/16
[52] U.S. Cl. .................................... 430/322; 430/270; 430/325; 430/330; 430/914
[58] Field of Search ............... 430/322, 325, 326, 914, 430/270, 297, 330

[56] References Cited

U.S. PATENT DOCUMENTS 4,339,526 7/1982 Baise et al. ......................... 430/296
4,528,118 7/1985 Murase et al. ...................... 252/500

OTHER PUBLICATIONS

Chemical Abstracts, 104(b), 44406g (Abstract of JP-A-60-165,786).

Primary Examiner—José G. Dees
Attorney, Agent, or Firm—Stevens, Davis, Miller & Mosher

[57] ABSTRACT

A method for forming a pattern of conjugated system polymer which can be given an electrical conductivity by doping treatment which comprises forming a thin film of a polymeric sulfonium salt having a recurring unit represented by the following general formula:

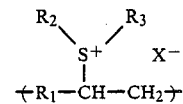

wherein $R_1$ represents a group capable of conjugating with an adjacent vinylene group formed by elimination of sulfonium salt as a side chain, $R_2$ and $R_3$ each represents hydrocarbon group having 1 to 20 carbon atoms, and $X^-$ represents counter ion, on a substrate, irradiating said thin film with a prescribed pattern of light including a deep ultraviolet ray having a wavelength not longer than 300 nm and then subjecting the thin film to development.

3 Claims, No Drawings

METHOD FOR FORMING FINE PATTERNS OF CONJUGATED POLYMERS

The present invention relates to a method for forming fine patterns of conjugated polymers.

Conjugated polymers become electrically conductive when doped. In addition, they are expected to be applicable to various devices such as a memory element, a sensor, a solar cell, a storage battery, etc. In considering their application to electronic devices, formation of such conjugated polymers into a desired fine pattern is a very advantageous technique in preparation of circuits made of such polymers and in development of device-making processes. For example, in Japanese Patent Application Kokai (Laid-Open) No. 165,786/85, there is mentioned a technique for forming a pattern of photopolymerized polydiacetylene which comprises coating a substrate with a solution of diacetylene monomer derivative, irradiating it with a pattern of ultraviolet light and removing the monomer from unexposed area with solvent.

However, if a solution of low molecular weight monomer is coated, the coating film is apt to become not uniform due to association, crystallization and the like, as the result of which the formed pattern cannot be sufficiently uniform and therefore such a method is disadvantageous particularly in the formation of fine patterns. Thus, it has been desired to form a pattern of conjugated polymer from a uniform thin film obtainable by coating the polymer. Since many of the conjugated polymers are insoluble and infusible, however, it has been difficult to obtain a thin film by the process of coating.

In U.S. Pat. No. 4,528,118, there is mentioned a method for obtaining a conjugated polymer by eliminating sulfonium salt as a side chain from a soluble polymeric sulfonium salt. In the specification of this patent, there is mentioned that the elimination of sulfonium salt can take place not only thermally but also by the action of visible rays and ultraviolet rays. However, a study of the present inventors on this method has revealed that fine and good patterns cannot be formed with usual visible and ultraviolet rays.

An object of the present invention is to provide a method for forming a fine pattern of conjugated polymer.

Thus, the present invention provides a method for forming a pattern of conjugated polymer which comprises forming a thin film of a polymeric sulfonium salt having a recurring unit represented by the following general formula:

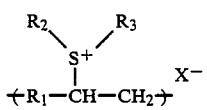
(I)

wherein $R_1$ represents a group capable of conjugating with an adjacent vinylene group formed by elimination of sulfonium salt as a side chain, $R_2$ and $R_3$ each represents hydrocarbon group having 1 to 20 carbon atoms and $X^-$ represents a counter ion, on a substrate, irradiating the thin film with a prescribed pattern of light including a deep ultraviolet ray having a wavelength not longer than 300 nm, and then subjecting the thin film to development.

Next, the invention will be illustrated in more detail below.

The polymeric sulfonium salt used in the present invention is represented by the above-mentioned general formula (I). As examples of $R_1$, there may be given hydrocarbon groups, derivatives thereof and heterocyclic groups conjugating with an adjacent vinylene group formed by elimination of sulfonium sult as a side chain. Concrete examples of $R_1$ include aromatic monocyclic hydrocarbon groups such as p-phenylene and substituted p-phenylenes (e.g. 2-ethyl-p-phenylene, 2,5-dimethyl-p-phenylene, 2,5-dimethoxy-p-phenylene and 2,5-diethoxy-p-phenylene); aromatic polycyclic hydrocarbon groups (e.g. 4,4'-biphenylene, 1,4-naphthylene and 2,7-phenanthrylene); acyclic unsaturated hydrocarbon groups (e.g. vinylene, 1-methylvinylene, 1-phenylvinylene and 1,4-butadienylene); monocyclic unsaturated heterocyclic groups (e.g. 2,5-thienylene); and the like. From the viewpoint of applicability to organic functional elements, groups showing a symmetry with regard to the main chain axis are particularly preferred for the sake of forming an electrically conductive pattern. Thus, p-phenylene, 2,5-dimethyl-p-phenylene, 2,5-dimethoxy-p-phenylene, 2,5-diethoxy-p-phenylene, 1,4-butadienylene, 2,5-thienylene and the like are effectively usable for this purpose. Among them, aromatic monocyclic hydrocarbon groups are particularly preferable, because they give a stable sulfonium salt.

$R_2$ and $R_3$ each represents hydrocarbon group having 1 to 20 carbon atoms such as methyl, ethyl, propyl, isopropyl, n-butyl, 2-ethylhexyl, dodecyl, octadecyl, phenyl, cyclohexyl, benzyl and the like, among which those having 1 to 6 carbon atoms are preferable and methyl and ethyl are particularly preferable.

As the counter ion $X^-$ of sulfonium salt, any counter ions can be used. In the invention, however, halogen ions, hydroxyl ion, boron tetrafluoride ion and perchlorate ion are preferable, and chlorine ion, bromine ion, iodine ion and hydroxyl ion are particularly preferable.

The polymeric sulfonium salt of the invention may be any of homopolymer of single monomer and copolymer of plural monomers.

Degree of polymerization of said polymeric sulfonium salt is 10 or above and more preferably 20 to 50,000.

Such polymeric sulfonium salts can be produced according to, for example, the method mentioned in U.S. Pat. No. 4,528,118, or the like.

Next, the method for the formation of pattern will be mentioned. As the process for preparing a thin film of polymeric sulfonium salt, spin coating, vapor deposition, deposition of Langmuir-Blodgett films, and the like can be referred to, among which spin coating process is preferable, because of simplicity of procedure and uniformity of resulting film.

When the thin film contains a solvent, the solvent is preferably removed by drying prior to the subsequent step.

In the next step, the thin film is exposed to a prescribed pattern of irradiation including deep ultraviolet rays.

The exposure can be carried out by means of a mask aligner or a stepper conventionally used in the manufacture of IC and LSI.

It is necessary in the invention to use a light comprising a deep ultraviolet ray having a wavelength not longer than 300 nm, preferably between 200 and 300 nm, and more preferably between 200 and 260 nm. If a light not comprising a deep ultraviolet ray having a wavelength not longer than 300 nm is used, the elimination reaction of sulfonium salt cannot progress sufficiently, and the resulting pattern becomes uneven or too thick so that no good fine pattern can be obtained even after a longterm irradiation. On the other hand, a light having a wavelength substantially shorter than 200 nm is also undesirable because such a light sometimes induces decomposition reaction other than elimination of sulfonium salt or promotes ozone formation and thereby destructs the conjugated structure and makes it impossible to obtain a good pattern or sometimes makes it impossible to obtain a product of high electrical conductivity after doping. As the light source used in the invention, low pressure arc mercury lamp, xenon-mercury arc lamp, zenon arc lamp, excimer laser and the like emitting a light of deep ultraviolet region having a wavelength not longer than 300 nm are preferable.

After exposure to light, the thin film is subjected to development to remove the polymeric sulfonium salt from the unexposed area, whereby a fine pattern can be formed.

The developing solution used in the development is not critical, so far as it can dissolve the polymeric sulfonium salt. Although protic solvents such as water, alcohol and the like are used usually, aprotic organic solvents can be more effective than protic solvent in some cases, depending on $R_1$ of polymeric sulfonium salt.

The pattern formed by the development contains a conjugated polymer. Usually, however, the pattern is yet insufficient in the amount of conjugated polymer and chain length of conjugated system, as it is. Accordingly, a heat treatment is preferably carried out additionally.

Although the temperature of the heat treatment may be decided appropriately in accordance with the kind of sulfonium salt, it is usually in the range of 100° C. to 400° C.

For example, when a polymeric sulfonium salt having the following formula:

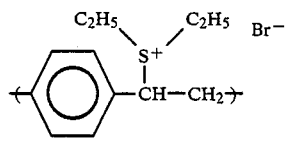

is used, the temperature of heat treatment should be in the range of 100° C. to 400° C.

As the atmosphere of the heat treatment, atmospheres containing no oxygen are desirable. Inert atmospheres of nitrogen, argon and the like are preferable.

Since the pattern prepared by the present invention is mainly composed of a conjugated polymer as has been mentioned above, it can be made into an electrically conductive pattern by a doping treatment.

The doping is carried out with a electron-donor or an electron-acceptor compound. For this purpose, compounds mentioned in the specification of U.S. Pat. No. 4,528,118 can be used effectively.

The doping can be carried out according to the well-known methods such as chemical doping, electrolytic doping, optical doping, ion inplantation and the like.

As has been mentioned above, the fine pattern of conjugated polymer prepared according to the method of the present invention can be given an electrical conductivity by doping and, in addition, it can be processed into arbitrary fine two-dimensional patterns. Accordingly, it is quite advantageously applicable to organic functional elements such as a memory element, a sensor, a solar cell, a storage battery and the like.

Next, the invention will be illustrated in more detail with reference to the following non-limitative examples.

EXAMPLE 1

Into 475 ml of distilled water was dissolved 28.4 g of p-xylylenebis(dimethylsulfonium chloride). Then, 475 ml of 0.4N aqueous solution of NaOH was dropped thereinto over a period of one hour, and the resulting mixture was stirred for 4 hours at 0° C. to 5° C. After the reaction, the mixture was adjusted to pH 4 with concentrated hydrochloric acid. The neutralzed mixture was dialyzed against water for 2 days through a dialyzing membrane of 8,500 molecular weight fractionation (Cellotube ®, manufactured by Union Carbide Co.). The dialyzed solution was spin-coated onto a silicon wafer at a rotation speed of 1,000 r.p.m. for 20 seconds and then air-dried to obtain a film of polymeric sulfonium salt having sulfonium salt on its side chains. The average thickness of the film was 0.18 μm.

Then, the film was irradiated with a pattern of deep ultraviolet light passing through a quartz photomask by the use of a mask aligner using xenon-mercury arc lamp as its light source, after which the film was developed with methanol. Thus, the polymeric sulfonium salt in the unexposed area was dissolved out, and there was formed a negative pattern.

Then, the pattern was heated at 200° C. for 20 minutes under a stream of nitrogen, and then infrared absorption spectrum of the pattern area was measured. As the result, it was revealed that the pattern was composed of poly-p-phenylenevinylene. The minimum line width of the pattern was 0.5 μm.

EXAMPLE 2

Into 200 ml of distilled water were dissolved 9.7 g of p-xylylenebis(dimethylsulfonium chloride) and 2.4 g of 2,5-dimethoxy-p-xylylenebis(dimethylsulfonium chloride). At a temperature of 0° to 5° C., 200 ml of 0.4N aqueous solution of NaOH was dropped thereinto over a period of one hour and the resulting mixture was continuously stirred for 4 hours. After the reaction, the mixture was adjusted to pH 4 with concentrated hydrochloric acid. Then the reaction mixture was dialyzed against water for 2 days through a dialyzing membrane of 8,500 molecular weight fractionation (Cellotube ®, manufactured by Union Carbide Co.).

The dialyzed solution was spin-coated onto a silicon wafer at a rotation speed of 1,000 r.p.m. for 20 seconds and then air-dried to form a film of polymeric sulfonium salt having sulfonium salt residues on its side chains. Its average thickness was 0.13 μm.

Next, it was exposed to light and developed in the same manner as in Example 1 to obtain a negative pattern.

Then, the pattern was heated at 200° C. for 20 minutes under a stream of nitrogen, after which the infrared absorption spectrum of the pattern area was measured. Thus, it was revealed that the pattern was composed of a copolymer of p-phenylenevinylene and 2,5-dimethoxy-p-phenylenevinylene. The minimum width of the pattern was 0.5 μm.

The pattern was doped by exposing it to an atmosphere of iodine. As the result, the pattern area had an electrical conductivity of 0.01 to 2 S/cm.

EXAMPLE 3

Into 200 ml of distilled water was dissolved 11.9 g of 2,5-dimethoxy-p-xylylenebis(dimethylsulfonium chloride). At a temperature of 0° to 5° C., 200 ml of 0.4N aqueous solution of NaOH was dropped thereinto over a period of one hour and the resulting mixture was stirred for 2 hours. After the reaction, the mixture was adjusted to pH 4 with concentrated hydrochloric acid. The reaction mixture was dialyzed against water for 2 days through a dialyzing membrane of 8,500 molecular weight fractionation (Cellotube®, manufactured by Union Carbide Co.). The dialyzed solution was coated onto a glass plate and dried under a stream of nitrogen to form a thin film of polymeric sulfonium salt having sulfonium salt on its side chains. Then, it was exposed to light and developed in the same manner as in Example 1 to form a negative pattern.

Then, the pattern was heated at 200° C. for 20 minutes under a stream of nitrogen and the infrared absorption spectrum of the pattern area was measured. Thus, it was revealed that the pattern was composed of poly-2,5-dimethoxy-p-phenylenevinylene.

Then the pattern was doped by exposing it to an atmosphere of iodine. As the result, the pattern area had an electrical conductivity of 1 to 100 S/cm.

COMPARATIVE EXAMPLE 1

The procedure of Example 1 was repeated, except that the xenon-mercury arc lamp was replaced with xenon arc lamp and pattern of light was irradiated by the use of a filter to cut off the lights having a wavelength of 300 nm or shorter. In the subsequent development, however, the exposed area was also dissolved out, so that no pattern could be formed.

What is claimed is:

1. A method for forming a fine pattern of conjugated system polymer which comprises forming a thin film of a polymeric sulfonium salt having a recurring unit represented by the following general formula:

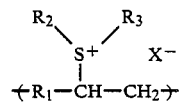

wherein $R_1$ represents a group capable of conjugating with an adjacent vinylene group formed by elimination of sulfonium salt as a side chain, $R_2$ and $R_3$ each represents hydrocarbon group having 1 to 20 carbon atoms, and $X^-$ represents counter ion, on a substrate, irradiating said thin film with a prescribed pattern of light including a deep ultraviolet ray having a wavelength between 200 and 300 nm and then subjecting the thin film to development.

2. A method for forming a pattern of conjugated system polymer according to claim 1, wherein said deep ultraviolet ray has a wavelength between 200 and 260 nm.

3. A method for forming a fine patern of conjugated stystem polymer according to claim 1, wherein a heat treatment of the fine pattern is carried out at a temperature of 100°–400° C. in an inert atmosphere after the development.

* * * * *